(12) United States Patent
Metzger et al.

(10) Patent No.: US 8,324,091 B2
(45) Date of Patent: Dec. 4, 2012

(54) ENHANCING INTEGRITY OF A HIGH-K GATE STACK BY CONFINING A METAL CAP LAYER AFTER DEPOSITION

(75) Inventors: Joachim Metzger, Butzbach (DE); Robert Binder, Dresden (DE); Markus Lenski, Dresden (DE); Klaus Hempel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 294 days.

(21) Appl. No.: 12/711,481

(22) Filed: Feb. 24, 2010

(65) Prior Publication Data

US 2010/0221906 A1 Sep. 2, 2010

(30) Foreign Application Priority Data

Feb. 27, 2009 (DE) .......................... 10 2009 010 846

(51) Int. Cl.
*H01L 21/3205* (2006.01)
(52) U.S. Cl. ................. 438/591; 257/E21.201
(58) Field of Classification Search .................. 438/591, 438/592, 756; 257/E21.201, E21.204
See application file for complete search history.

(56) References Cited

U.S. PATENT DOCUMENTS

| | | | |
|---|---|---|---|
| 6,049,114 A | 4/2000 | Maiti et al. | 257/412 |
| 6,225,658 B1 * | 5/2001 | Watanabe | 257/296 |
| 8,026,539 B2 * | 9/2011 | Hargrove et al. | 257/288 |

FOREIGN PATENT DOCUMENTS

| | | |
|---|---|---|
| DE | 102007061527 A1 | 6/2009 |
| WO | WO2007/031928 A2 | 3/2007 |
| WO | WO2008/112263 A1 | 9/2008 |

OTHER PUBLICATIONS

Translation of Official Communication from German Patent Office for German Patent Application No. 10 2009 010 846.7-33 dated Oct. 21, 2009.

* cited by examiner

*Primary Examiner* — Quoc Hoang
(74) *Attorney, Agent, or Firm* — Williams, Morgan & Amerson, P.C.

(57) ABSTRACT

During a manufacturing sequence for forming a sophisticated high-k metal gate structure, a cover layer, such as a silicon layer, may be deposited on a metal cap layer in an in situ process in order to enhance integrity of the metal cap layer. The cover layer may provide superior integrity during the further processing, for instance in view of performing wet chemical cleaning processes and the subsequent deposition of a silicon gate material.

24 Claims, 8 Drawing Sheets

ENHANCING INTEGRITY OF A HIGH-K GATE STACK BY CONFINING A METAL CAP LAYER AFTER DEPOSITION

BACKGROUND OF THE INVENTION

1. Field of the Invention

Generally, the present disclosure relates to the fabrication of highly sophisticated integrated circuits including advanced transistor elements that comprise gate structures of increased capacitance including a high-k gate dielectric and a metal-containing electrode material.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of circuits, field effect transistors represent one important type of circuit element that substantially determines performance of the integrated circuits. Generally, a plurality of process technologies are currently practiced for forming field effect transistors, wherein, for many types of complex circuitry, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed between the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity, which in turn causes an increase of gate resistivity due to the reduced dimensions, is a dominant design criterion for accomplishing an increase in the operating speed of the integrated circuits.

Presently, the vast majority of integrated circuits are based on silicon due to its substantially unlimited availability, the well-understood characteristics of silicon and related materials and processes and the experience gathered during the last 50 years. Therefore, silicon will likely remain the material of choice for future circuit generations produced by volume production techniques. One reason for the dominant role of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, during anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon and metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode, to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a very pronounced dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required high capacitance between the gate and the channel region. For example, a channel length of approximately 80 nm may require a gate dielectric made of silicon dioxide as thin as approximately 1.2 nm. Although the usage of high speed transistor elements having an extremely short channel may be restricted to high speed signal paths, whereas transistor elements with a longer channel may be used for less critical circuit portions, such as storage transistor elements, the relatively high leakage current caused by direct tunneling of charge carriers through an ultra-thin silicon dioxide gate insulation layer may reach values for an oxide thickness in the range or 1-2 nm that may not be compatible with requirements for performance driven circuits, even if only transistors in speed critical paths are formed on the basis of an extremely thin gate oxide.

Therefore, replacing silicon dioxide as the material for gate insulation layers has been considered, particularly for extremely thin silicon dioxide gate layers. Possible alternative materials include materials that exhibit a significantly higher permittivity so that a physically greater thickness of a correspondingly formed gate insulation layer provides a capacitive coupling that would be obtained by an extremely thin silicon dioxide layer. Commonly, a thickness required for achieving a specified capacitive coupling with silicon dioxide is referred to as capacitance equivalent thickness (CET). Thus, at a first glance, it appears that simply replacing the silicon dioxide with high-k materials is a straightforward way to obtain a capacitance equivalent thickness in the range of 1 nm and less.

It has thus been suggested to replace silicon dioxide with high permittivity materials such as tantalum oxide ($Ta_2O_5$), with a k of approximately 25, strontium titanium oxide (Sr- TiO$_3$), having a k of approximately 150, hafnium oxide (HfO$_2$), HfSiO, zirconium oxide (ZrO$_2$) and the like.

Additionally, transistor performance may be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides an increased capacitance based on the same or greater thickness as a silicon dioxide layer, while additionally maintaining leakage currents at an acceptable level. On the other hand, the non-polysilicon material, such as titanium nitride and the like, may be formed so as to connect to the high-k dielectric material, thereby substantially avoiding the presence of a depletion zone.

After forming sophisticated gate structures including a high-k dielectric material, however, high temperature treatments may be required which may result in a shift of the work function and a reduction of the permittivity of the gate dielectric, which may also be associated with an increase of layer thickness, thereby offsetting many of the advantages of the high-k dielectric material in combination with the metal-containing electrode material. It is believed that the deterioration of the high-k metal gate may be substantially caused by the interaction of gate stack materials with oxygen and respective oxygen diffusion, which may thus result in a variation of the overall characteristics of the metal gate stack. For example, hafnium oxide and zirconium oxide may exhibit a very high oxidation rate in the presence of oxygen and elevated temperatures, thereby resulting in pronounced modifications of the material characteristics, which may finally lead to significant transistor variability. Consequently, a metal-containing material layer may be formed on the high-k dielectric material to reduce any interaction with the ambient atmosphere, while at the same time providing enhanced performance, since any depletion zone as is typically encountered in polysilicon materials may be avoided. Moreover, upon completing the gate structure, for instance by depositing a standard polysilicon material, a thin silicon nitride spacer may be formed on sidewalls of the gate structure in order to avoid undue exposure of the sensitive materials, i.e., of the high-k dielectric material and metal-containing electrode material, to the ambient atmosphere. For example, a silicon nitride liner having a thickness of one to several nanometers may typically be formed on sidewalls of the gate structure and may be maintained throughout the entire process sequence. Although superior integrity of the sensitive gate stack materials may be accomplished by the metal-containing electrode material and the silicon nitride liner, it nevertheless turns out that a pronounced transistor variability may be observed, for instance in view of threshold variations, which is believed to be caused by interaction of oxygen with the metal-containing electrode material, as will be explained in more detail with reference to FIGS. 1a-1d.

Figure 1A:
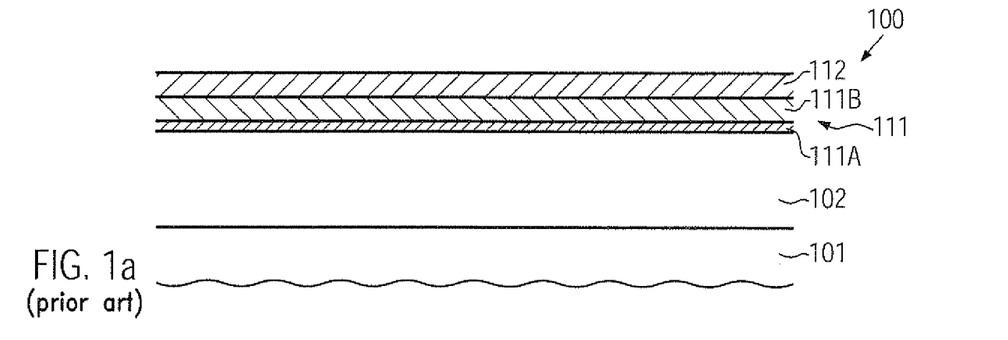
FIGS. 1a-1d schematically illustrate cross-sectional views of a conventional sophisticated semiconductor device during forming a transistor including a high-k metal gate using conventional manufacturing strategies.

FIG. 1a schematically illustrates a cross-sectional view of a semiconductor device 100 at an early manufacturing stage in forming a sophisticated gate electrode structure according to conventional strategies. As illustrated, the semiconductor device 100 comprises a substrate 101, such as a silicon substrate and the like, above which is formed a semiconductor layer 102, such as a crystalline silicon layer, which may additionally comprise other components, such as germanium and the like. It should be appreciated that a buried insulating material (not shown) may be provided between the substrate 101 and the semiconductor layer 102 if a silicon-on-insulator (SOI) configuration is considered. The portion of the semiconductor layer 102 as shown in FIG. 1a may represent a portion of an active region, i.e., of a semiconductor region having incorporated therein or receiving an appropriate dopant distribution so as to form corresponding PN junctions as required for a transistor to be formed in and above the semiconductor layer 102. For example, the portion of the semiconductor layer 102 shown in FIG. 1a may include a P-type dopant species for forming an N-channel transistor and the like. Moreover, in the manufacturing stage shown, a gate insulation layer 111 is formed on the semiconductor layer 102, wherein the gate insulation layer 111 may typically comprise a high-k dielectric material 111B having an appropriate thickness and permittivity to obtain a desired capacitance equivalent thickness at reduced leakage currents compared to a silicon dioxide based gate dielectric, as previously explained. Furthermore, in view of the superior interface characteristics, a very thin "conventional" dielectric material 111A, for instance in the form of a silicon dioxide material, may be provided, thereby obtaining enhanced stability during subsequent high temperature processes. For example, a thickness of the oxide material 111A may be 0.5-1.0 nm. Furthermore, as discussed above, a metal-containing cap material or electrode material 112 is typically provided on the gate insulation layer 111 so as to reduce any interaction with the ambient atmosphere during the further processing of the device 100. For example, the layer 112 may be provided in the form of titanium nitride, while the high-k dielectric layer 111B may be comprised of hafnium oxide.

Typically, the semiconductor device 100 may be formed on the basis of well-established process techniques involving an oxidation process for forming the base oxide layer 111A, followed by the deposition of the high-k dielectric material 111B by any appropriate deposition technique, such as chemical vapor deposition (CVD), physical vapor deposition (PVD), atomic layer deposition (ALD) and the like. Thereafter, the titanium nitride layer 112 may be deposited at moderately low temperatures, for instance by sputter deposition, CVD, PVD and the like, thereby confining the sensitive material 111B. It turns out, however, that the titanium nitride material may itself exhibit an increased affinity to oxygen and may thus show an increased oxidation rate, which is believed to result in significant modifications of the overall gate stack in combination with the subsequent deposition of a polysilicon material. Typically, in many semiconductor processes, many types of oxides, such as silicon dioxide and the like, may be removed prior to a subsequent treatment by performing a cleaning process on the basis of well-established wet chemical etch recipes, such as hydrofluoric acid (HF), which, however, may not be a viable option for forming sophisticated gate electrode structures. For example, in conventional gate patterning processes in which silicon dioxide based gate dielectrics are used, the exposure to the wet chemical etch recipe would result in undue erosion of the gate dielectric material. In this case, an appropriate scheduling of processing substrates may be implemented into the overall process flow, that is, the queue time prior to depositing the polysilicon material on the silicon dioxide based gate dielectric may be appropriately selected so as to maintain the interaction of the gate dielectric material with the ambient atmosphere at an acceptable level.

Figure 1B:
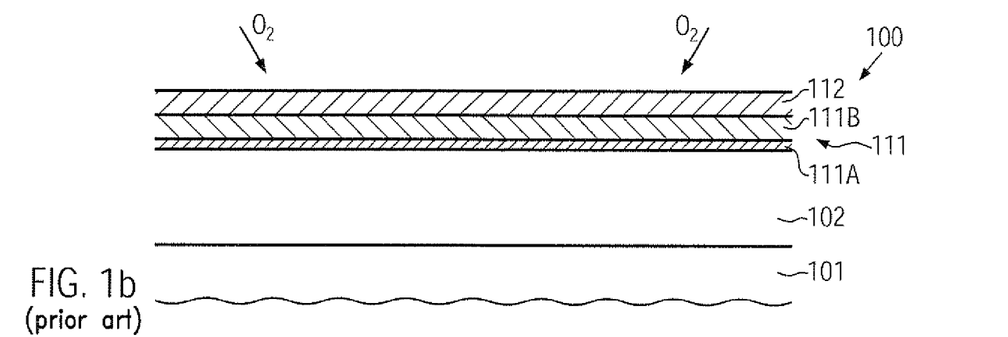

FIG. 1b schematically illustrates the semiconductor device 100 in the time between the deposition of the titanium nitride layer 112 and the deposition of the polysilicon material, whereby exposing the material 112 to ambient atmosphere and thus oxygen may be present and may interact with the titanium nitride material. However, contrary to conventional silicon dioxide based materials, the titanium nitride layer 112 may exhibit a higher oxidation rate which may thus result in a more pronounced accumulation of oxide which may strongly depend on the scheduling within the semiconductor facility. That is, an appropriate queue time for maintaining device variability at an acceptable level would not be compatible with the scheduling within a complex semiconductor facility, since overall throughput may be significantly reduced or significant additional resources may have to be implemented.

Figure 1C:
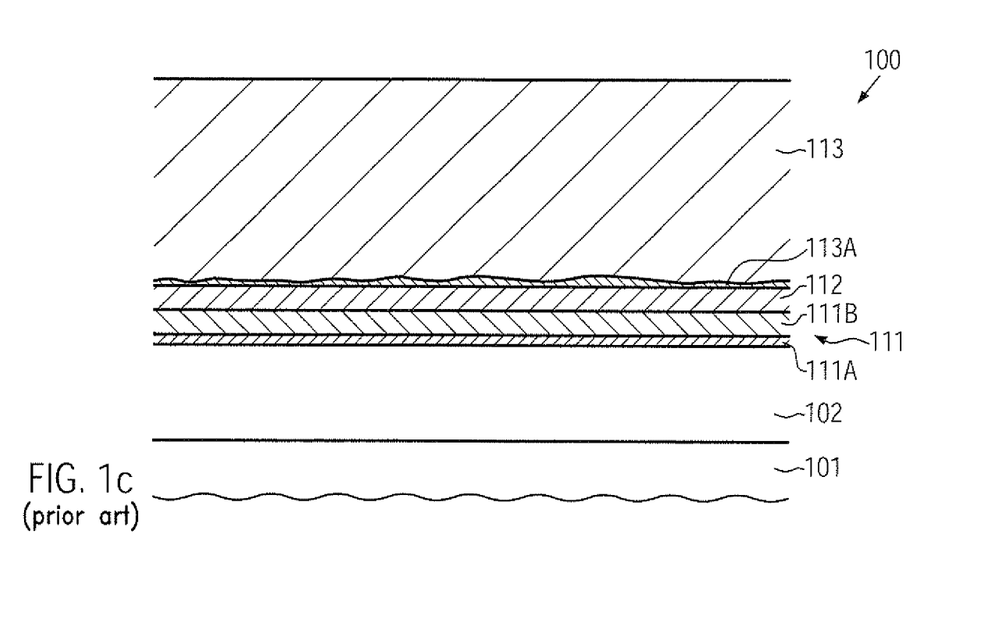

FIG. 1c schematically illustrates the semiconductor device 100 in a further advanced manufacturing stage. As illustrated, a layer of polysilicon material 113 is formed above the electrode material 112, which is typically accomplished by using well-established low pressure CVD techniques performed at appropriate high temperatures of approximately 600° C. and higher, depending on the desired crystalline structure of the polysilicon material 113. Due to the presence of oxygen, for instance in the form of oxide material of the layer 112, a silicon dioxide material 113A may form during the deposition of the silicon material 113, wherein a thickness and uniformity thereof may significantly depend on the previous process history due to the strong dependence on queue time, as discussed above. Consequently, the layer 113A may form in a highly non-predictable manner, thereby contributing to a significant variation of transistor characteristics, such as threshold voltage, gate resistivity and the like.

Figure 1D:
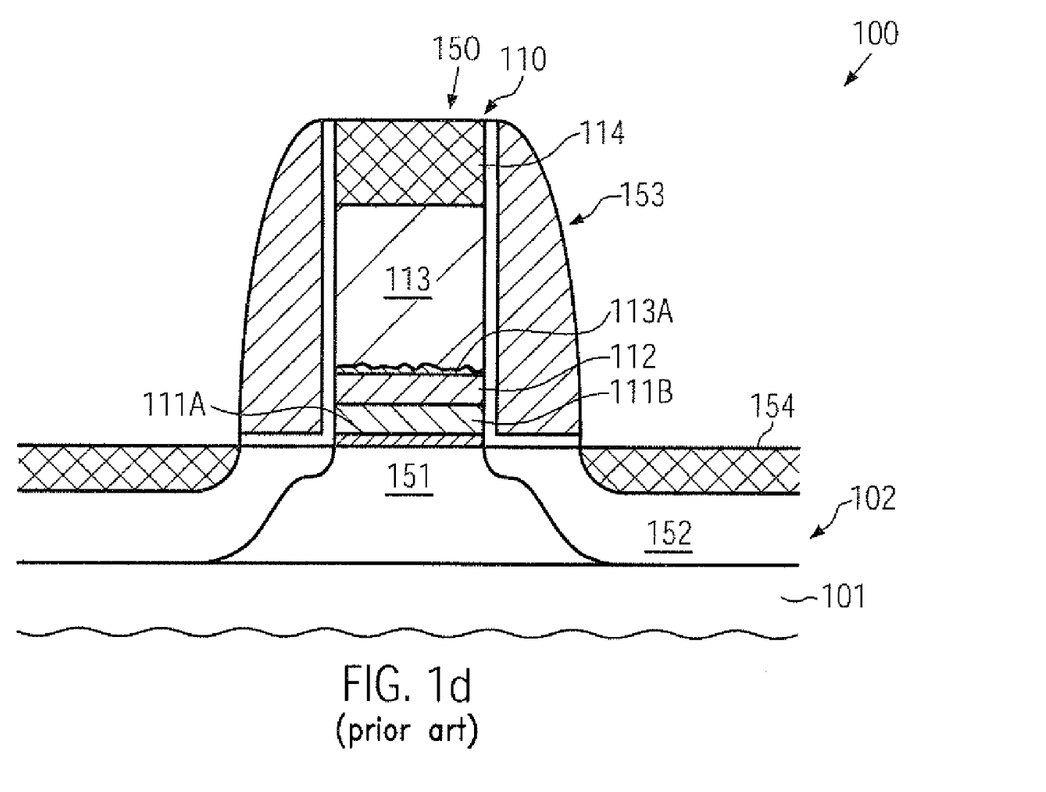

FIG. 1d schematically illustrates the semiconductor device 100 in a very advanced manufacturing stage in which a transistor 150 comprises a gate electrode structure 110 including the layers 111A, 111B as a gate insulation layer, the metal-containing electrode material or cap material 112 and the further electrode material 113 in the form of a polysilicon material, wherein the silicon dioxide residues 113A may still be present in a more or less pronounced manner. Furthermore, the gate electrode structure 110 may comprise a metal silicide material 114. Furthermore, a spacer structure 153 may be formed on sidewalls of the gate electrode structure 110 and drain and source regions 152 are formed in the silicon layer 102, wherein metal silicide regions 154 may be formed in a portion of the drain and source regions 152. The components described so far may be formed in accordance with well-established process techniques. As discussed above, due to the presence of the silicon dioxide residues 113A, a significant degree of variability of characteristics of the transistor 150 may be observed, since the additional dielectric material of the residues 113A have an effect on the coupling into a channel region 151, for instance for creating an inversion layer therein, which may thus result in a variability with respect to the threshold voltage of the transistor 150. Additionally, the overall resistivity of the gate electrode structure 110 may also be strongly affected by the layer 113A.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides techniques in which enhanced integrity of sophisticated gate electrode structures may be achieved during a complex manufacturing sequence in forming a further electrode material above a metal-containing cap material or electrode material by providing an appropriate cover layer, such as a semiconductor material, which may be formed on the metal-containing material without exposing the same to the ambient atmosphere. The cover layer may thus provide enhanced integrity during the subsequent deposition of a further electrode material, such as silicon, germanium, a silicon/germanium mixture and the like. In some illustrative embodiments, the cover layer may provide etch stop capabilities during a wet chemical cleaning process immediately prior to the deposition of the further electrode material, thereby even further enhancing overall uniformity of the resulting sophisticated gate stack. Consequently, increased flexibility may be achieved with respect to the scheduling of the overall process sequence, while at the same time reducing transistor variability which may significantly depend on the scheduling in the semiconductor facility according to conventional strategies.

One illustrative method disclosed herein comprises forming a metal-containing electrode material on a gate insulation layer in an oxygen-depleted ambient, wherein the gate insulation layer is formed above a substrate of a semiconductor device and comprises a high-k dielectric material. The method further comprises forming a first semiconductor material on the metal-containing electrode material in the oxygen-depleted ambient. Additionally, the method comprises forming a second semiconductor material above the first semiconductor material. Moreover, an etch mask is formed above the first semiconductor material, and the second semiconductor material, the first semiconductor material and the metal-containing electrode material are patterned so as to form a gate electrode structure of a transistor.

A further illustrative method disclosed herein relates to forming a gate electrode structure of a transistor. The method comprises performing a process sequence for forming a metal-containing material on a gate insulation layer and forming a cover layer on the metal-containing material without exposing the metal-containing material to ambient atmosphere. The method further comprises performing a wet chemical cleaning process on the cover layer and forming an electrode material above the metal-containing material. Finally, at least the metal-containing material and the electrode material are patterned so as to form the gate electrode structure.

A still further illustrative method disclosed herein relates to forming a gate electrode structure of a transistor. The method comprises forming a first electrode material on a gate insulation layer and forming a second electrode material on the first electrode material while maintaining the first electrode material in an oxygen-depleted ambient, wherein the second electrode material comprises at least one of silicon and germanium. Additionally, a third electrode material is formed on the second electrode material and at least the first, the second and the third electrode materials are patterned on the basis of an etch mask.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides techniques in which enhanced integrity of sophisticated gate stacks may be accomplished by appropriately covering a metal-containing electrode material or cap material prior to exposing the device to ambient atmosphere. For this purpose, in some illustrative embodiments, the cover layer may comprise a material that may act as an electrode material, thereby not unduly affecting the operational behavior of the gate electrode structure. In other illustrative embodiments, the cover layer may have at least a very similar etch behavior compared to an additional electrode or placeholder material which may be removed in a very advanced manufacturing stage by performing a highly selective etch process. The cover layer may be deposited on the metal-containing electrode material in an oxygen-depleted ambient, which is to be understood as any process ambient in which low pressure conditions may be established so that the absolute amount of oxygen that may still be present in the deposition ambient may be less by approximately 80% or more compared to the oxygen contents of ambient atmosphere, which corresponds to the atmosphere within a typical clean room environment used in semiconductor facilities. In some illustrative embodiments, the oxygen-depleted ambient may be established within an appropriate process tool, such as a cluster tool, which may comprise a plurality of process chambers so that the oxygen-depleted atmosphere may be maintained at least in two process steps and an intermediate transport activity required for forming the metal-containing electrode material and the cover layer. Furthermore, in further illustrative embodiments, the subsequent deposition of a further electrode material, such as silicon, silicon/germanium, germanium and the like, may be preceded by a wet chemical cleaning process, for instance on the basis of HF and the like, so as to further reduce any contaminants, such as oxides and the like, wherein the cover layer may provide the integrity of the sensitive materials, i.e., the metal-containing electrode material and the high-k gate dielectric material. Consequently, enhanced flexibility in scheduling the overall process sequence may be achieved since any queue time requirements prior to depositing a further electrode material above the metal-containing electrode material may be relaxed, while at the same time enhanced uniformity of the overall characteristics of the gate electrode structure may be obtained. In other cases, the metal-containing electrode material may be formed with a high degree of process uniformity due to a significant reduction of any silicon dioxide based residues in process strategies in which the metal-containing electrode material may be provided in a very advanced manufacturing stage. Also in this case, advanced transistor characteristics may be obtained since the work function, which may be defined by the material composition of the additional electrode material and the thickness and characteristics of the previously formed metal-containing electrode material, may be adjusted with an increased degree of uniformity compared to conventional strategies.

With reference to FIGS. 2a-2j further illustrative embodiments will now be described in more detail, wherein reference may also be made to FIGS. 1a-1d, if appropriate.

Figure 2A:
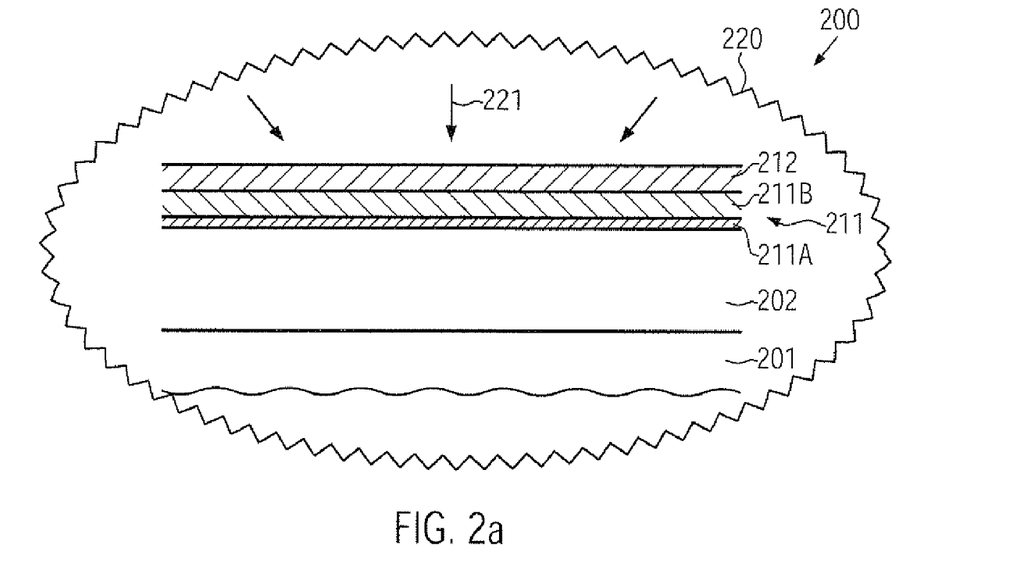
FIGS. 2a-2b schematically illustrate cross-sectional views of a semiconductor device during a process sequence for forming sensitive material layers of a sophisticated gate electrode stack by using an oxygen-depleted process ambient, according to illustrative embodiments.

FIG. 2a schematically illustrates a cross-sectional view of a semiconductor device 200 comprising a substrate 201 above which may be formed a semiconductor layer 202, such as a silicon layer, a silicon/germanium layer and the like, wherein additional components may also be incorporated in order to appropriately adjust the electronic characteristics required for transistor elements to be formed in and above the semiconductor layer 202. As previously explained with reference to the device 100, a buried insulating material (not shown) may be positioned between the substrate 201 and the semiconductor layer 202, if an SOI configuration is considered. Furthermore, a high-k gate insulation layer 211 is formed on the semiconductor layer 202 and may have any appropriate composition as required for the sophisticated gate electrode structure under consideration. In the embodiment shown, the layer 211 may comprise a high-k dielectric material 211B, such as hafnium oxide, zirconium oxide and the like, which may be separated from the semiconductor layer 202 by an additional dielectric material 211A, such as a silicon dioxide, a silicon/germanium oxide, a silicon/oxygen/nitrogen material and the like. It should be appreciated, however, that any other stack of layers or even a single layer may be used for the high-k gate insulation layer 211, depending on the overall device requirements. Furthermore, a metal-containing electrode material 212 or cap material may be formed on the gate insulation layer 211 so as to provide enhanced integrity thereof and also avoid the formation of any depletion zones after completing the semiconductor device 200 and operating the same, as previously explained.

The semiconductor device 200 as illustrated in FIG. 2a may be formed on the basis of the following processes. The semiconductor layer 202 may be appropriately processed to define respective active regions, as is also previously explained. For example, a basic dopant profile may be established and appropriate isolation structures (not shown) may be formed on the basis of well-established process techniques. Thereafter, the high-k gate insulation layer 211 may be formed, for instance on the basis of process techniques as also previously described. The layer 211B may be formed, for instance, in some illustrative embodiments, in a process ambient 220, which may represent any appropriate deposition ambient and which may be considered as an oxygen-depleted ambient in the above-defined sense. In other illustrative embodiments, the oxygen-depleted ambient 220 may be established so as to perform a deposition process 221 for forming the metal-containing electrode material 212. For example, the deposition process 221 may result in the deposition of a titanium nitride material, an aluminum oxide material and the like, as may be required for obtaining desired overall characteristics of a gate electrode structure still to be formed. It should be appreciated that any appropriate deposition technique, as previously explained with reference to the device 100, may be used within the process ambient 220. With respect to any other characteristics of the materials 211A, 211B and 212, such as layer thickness and the like, it is to be appreciated that any device and process specific values may be selected.

Figure 2B:
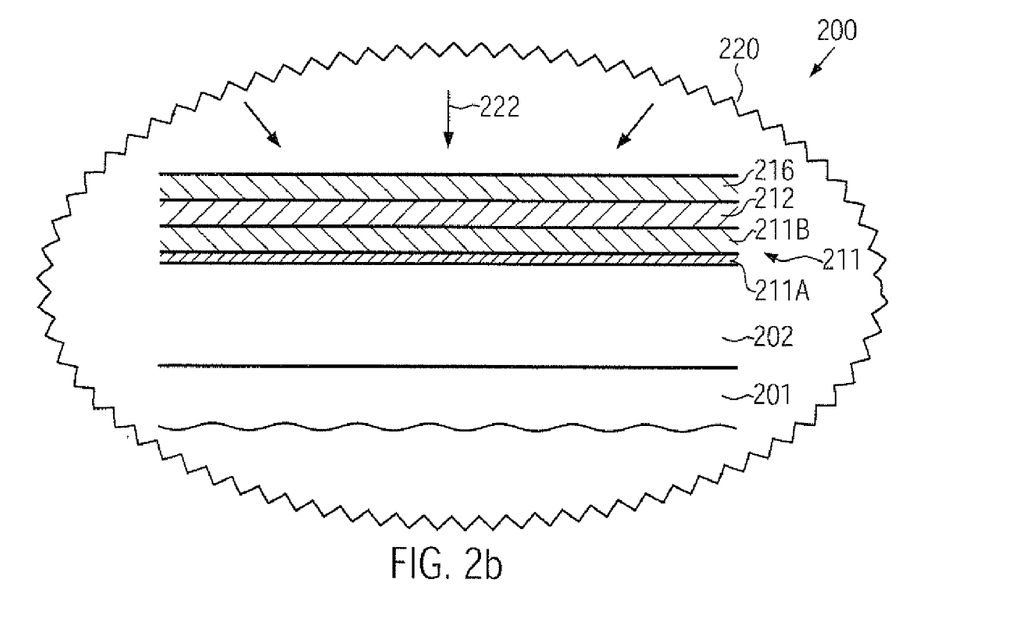

FIG. 2b schematically illustrates the semiconductor device 200 in a further advanced manufacturing stage in which the device 200 may be maintained within the oxygen-depleted ambient 220 in order to suppress undue interaction of the layer 212 with oxygen. It should be appreciated that the oxygen-depleted ambient 220 may typically be established on the basis of low pressure conditions, possibly in combination with inert gases, thereby also reducing the amount of other reactive components, such as fluorine and the like, which may typically be present in minute amounts in the ambient atmosphere. The semiconductor device 200 may be exposed to a further deposition ambient 222 in order to form a cover layer 216 on the metal-containing material 212. In some illustrative embodiments, the layer 216 may be provided in the form of a semiconductor material, such as silicon, germanium, a silicon/germanium mixture, which may provide a high degree of compatibility with a further electrode material still to be formed. In order to avoid undue interaction of material 212 with any components within the oxygen-depleted atmosphere 220, in some illustrative embodiments, a deposition temperature of approximately 400° C. and less may be selected, thereby significantly reducing the probability of creating oxide residues. The cover layer 216 may be provided with at least a thickness of atomic layers, for instance with a thickness of 0.5 nm to several nanometers, in order to significantly reduce the probability of oxygen diffusion through the layer 216. Furthermore, a thickness in the above-specified range may provide sufficient etch stop capabilities during a wet chemical cleaning process that may be performed in a later manufacturing stage.

Figure 2C:
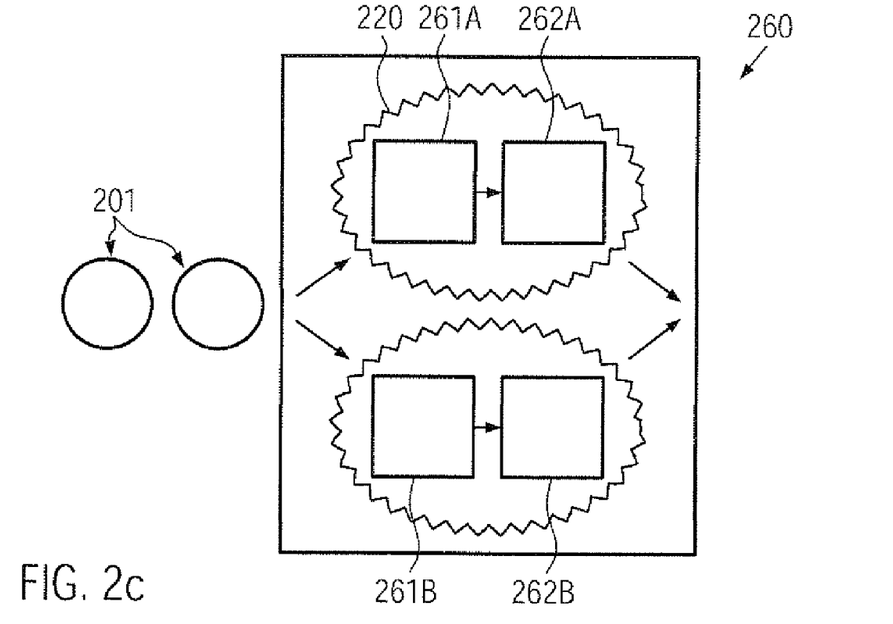
FIG. 2c schematically illustrates a process tool for performing a process sequence for forming a metal-containing electrode material and covering the same by an appropriate cover layer, such as a silicon- and/or germanium-containing material layer, according to illustrative embodiments.

FIG. 2c schematically illustrates a process tool 260 which may be appropriate for forming at least the layers 212 and 216 (FIG. 2b) on the basis of the oxygen-depleted ambient 220. In the embodiment shown, the process tool 260 may represent a cluster tool comprising a plurality of process chambers 261A, 261B, 262A, 262B in which a parallel and serial processing of the substrates 201 may be accomplished. For example, the chambers 261A, 262A may represent a sequence of process steps for depositing the layers 212 and 216. Similarly, the process chambers 261B, 262B may provide a parallel sequence for forming the layers 212 and 216, thereby increasing the overall throughput of the tool 260. It should be appreciated that additional process steps may be included into the tool 260, depending on the overall complexity thereof. For example, additional process chambers may be provided so as to deposit the high-k dielectric material 211B (FIG. 2b) possibly also within the oxygen-depleted ambient 220. As illustrated, additional transport activities between the process chambers 261A, 262A may be performed within the ambient 220, thereby avoiding undue exposure to the ambient atmosphere. In other illustrative embodiments, the process chambers 261A, 262A may not be provided within a single mainframe, i.e., as long as avoidance of undue exposure to the ambient atmosphere during a corresponding transport activity and corresponding queue times may be ensured. In the embodiment shown, after processing in the chambers 262A, 262B, the substrate 201 may have enhanced integrity with respect to exposure to oxygen and thus may provide enhanced flexibility in scheduling the overall process flow within the semiconductor facility.

Figure 2D:
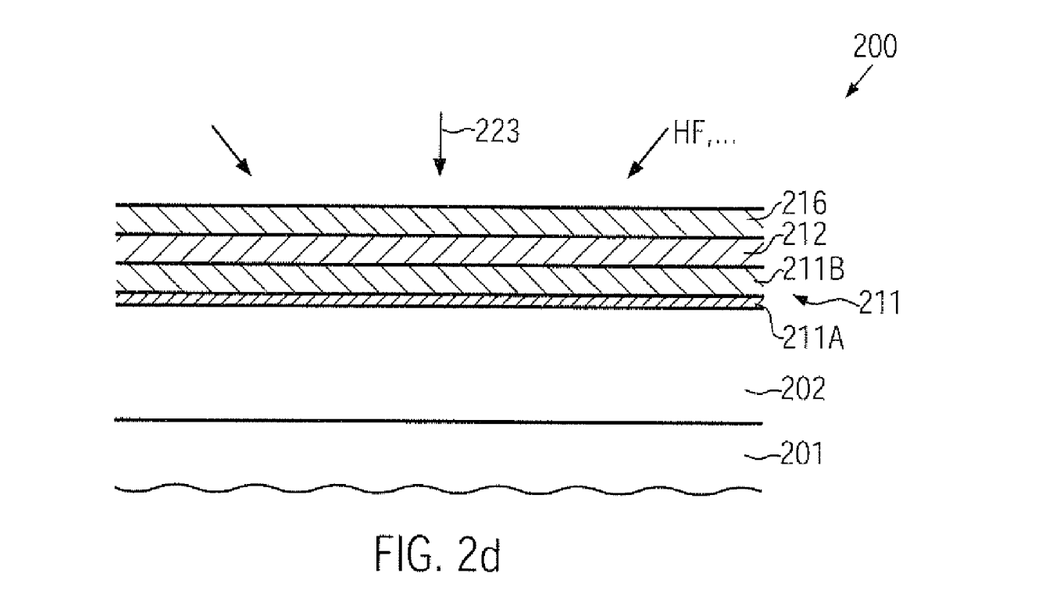
FIGS. 2d-2e schematically illustrate the semiconductor device in further advanced manufacturing stages according to illustrative embodiments.

FIG. 2d schematically illustrates the semiconductor device 200 according to illustrative embodiments in which the device 200 may be exposed to a wet chemical cleaning process 223, which may be performed on the basis of any appropriate cleaning recipe, for instance using HF, APM (ammonium hydrogen peroxide mixture) and the like. As previously explained, the layer 216 may provide a significant increase in flexibility with respect to any queue times in view of the deposition of a further electrode material, such as silicon and the like, since significant oxygen diffusion through the layer 216 and into the layer 212 may be suppressed. On the other hand, oxide that may form on the layer 216 may be reduced by the "late" cleaning process 223, which may be performed shortly before a subsequent deposition process. During the process 223, oxide materials may be efficiently removed, while the layer 216, for instance provided in the form of a silicon material, a silicon/germanium material, a germanium material and the like, may protect the layer 212.

Figure 2E:
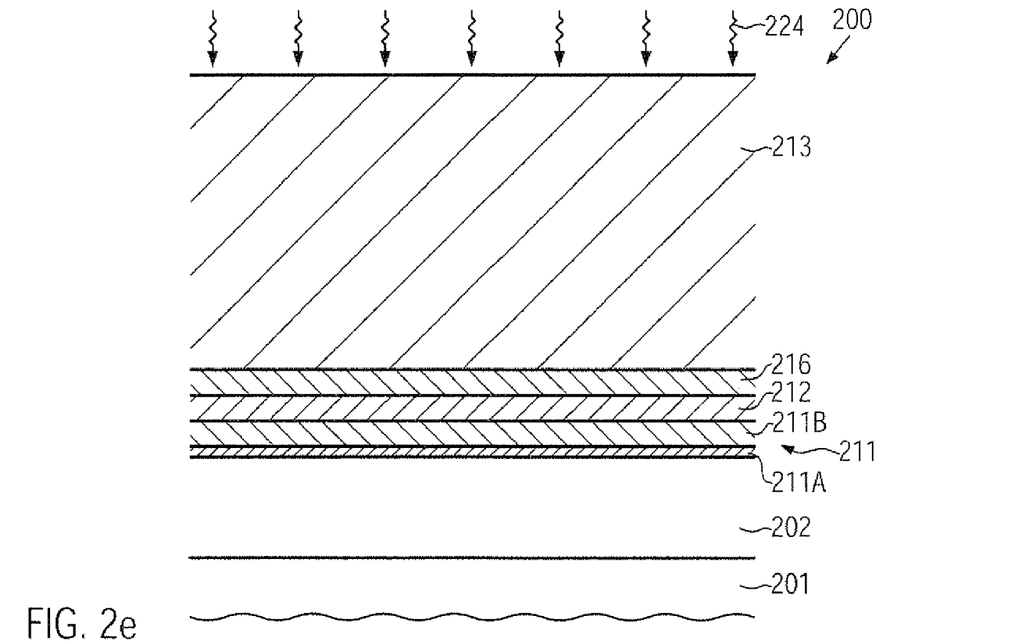

FIG. 2e schematically illustrates the semiconductor device 200 during a further deposition process 224, in which an electrode material 213, such as silicon, silicon/germanium, germanium and the like, may be deposited. During the deposition process 224, appropriate elevated temperatures may be used in order to provide a substantially amorphous structure of the material 213 or to provide a polycrystalline structure, depending on the overall process strategy. It should be appreciated that, after the deposition of the electrode material 213, any further materials may be formed thereon, such as a cap material, a hard mask material and the like, as may be required for patterning the layer stack comprising the layers 212, 216 and 213.

Figure 2F:
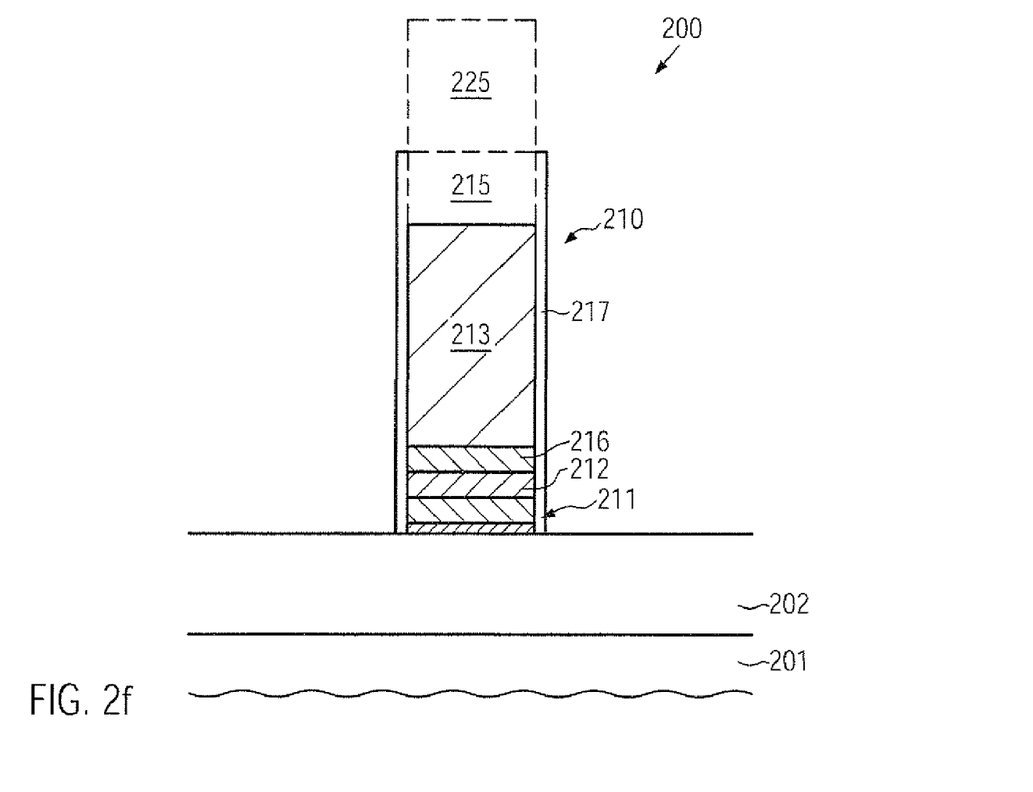
FIGS. 2f-2g schematically illustrate cross-sectional views of a semiconductor device including two different types of transistors during various manufacturing stages according to illustrative embodiments.

FIG. 2f schematically illustrates the semiconductor device 200 in a further advanced manufacturing stage. As illustrated, the layers 213, 216, 212 and 211, possibly in combination with a cap material 215, such as a silicon nitride material, may be patterned into a gate electrode structure 210. Furthermore, a liner 217, such as a silicon nitride liner, may be formed on sidewalls of the gate electrode structure 210, as is also previously explained. The patterning of the semiconductor device 200 may be accomplished on the basis of any appropriate etch mask, which is indicated by the dashed lines 225. The patterning of the gate electrode structure 210 may be accomplished on the basis of any appropriate process techniques involving sophisticated lithography and etch processes. Thereafter, the liner 217 may be formed by sophisticated thermally activated CVD techniques followed by anisotropic etch processes. Thus, the gate electrode structure 210 may include the material 216 that may provide superior interface characteristics between the materials 213 and 212, thereby resulting in superior transistor performance after completing the transistor structure on the basis of the gate electrode structure 210.

Figure 2G:
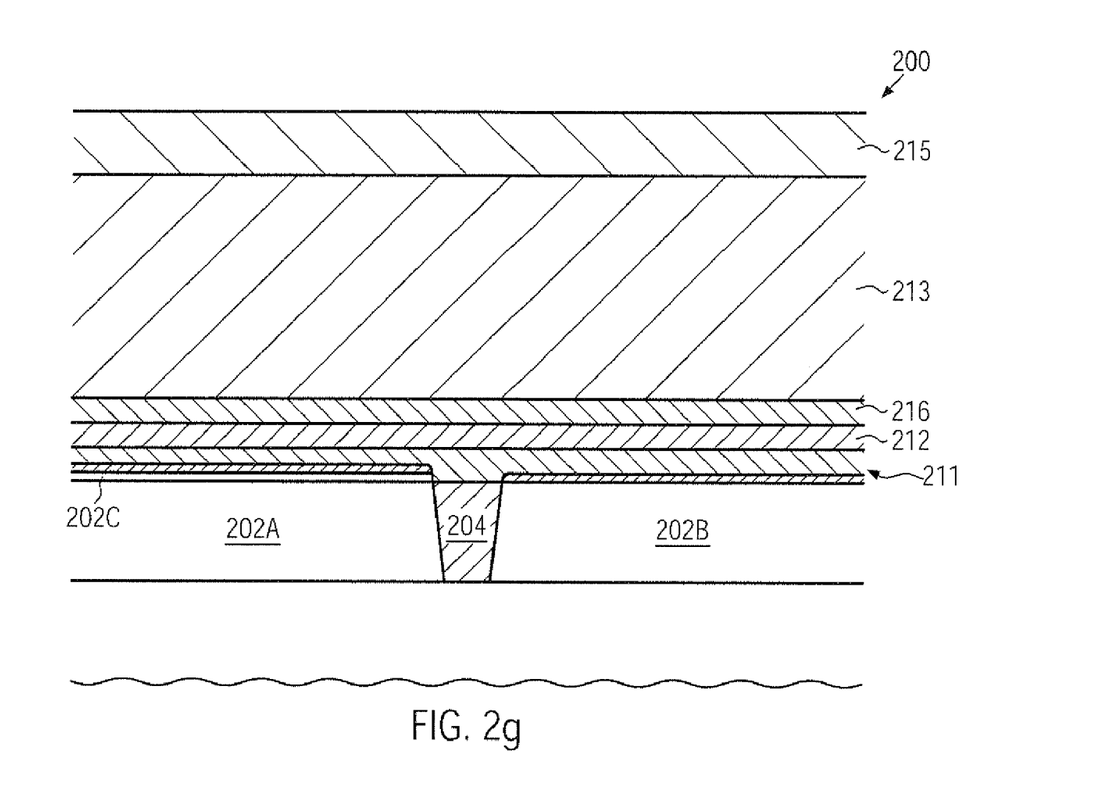

FIG. 2g schematically illustrates the semiconductor device 200 according to illustrative embodiments in which a sophisticated gate electrode structure may be formed in accordance with a process sequence previously described with reference to FIGS. 2a-2e, wherein, additionally, threshold adjustment for one type of transistor may be accomplished by providing a threshold adjusting semiconductor material. For this purpose, in one active region 202A, which may represent the active region of a P-channel transistor, a semiconductor alloy 202C, such as a silicon/germanium alloy, may be formed in order to appropriately set the band gap with respect to the gate electrode structure to be formed from the layers 211, 212, 216 and 213. On the other hand, the threshold adjustment obtained by these materials may be appropriate for an N-channel transistor to be formed in and above a second active region 202B. The device 200 as illustrated in FIG. 2g may be formed on the basis of well-established process techniques, in which an isolation structure 204 may be formed within the semiconductor layer 202 so as to delineate the active regions 202A, 202B. Thereafter, the active region 202B may be masked, for instance by an oxide layer, and the semiconductor alloy 202C may be formed by a selective epitaxial growth process in which the layer 202C may be formed with a predetermined composition and thickness. Thereafter, the layers 211, 212, 216 and 213, possibly in combination with the layer 215, may be deposited as previously described.

Figure 2H:
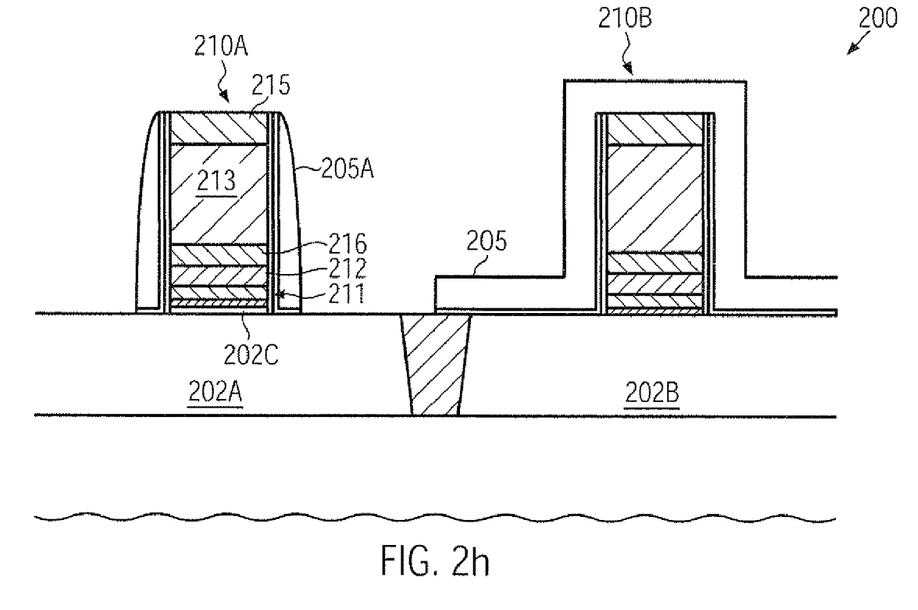
FIGS. 2h-2k schematically illustrate cross-sectional views of the semiconductor device according to illustrative embodiments in which a metal-containing electrode material may be formed in the gate electrode structure after completing the basic transistor configuration.

FIG. 2h schematically illustrates the semiconductor device 200 in a further advanced manufacturing stage according to illustrative embodiments in which gate electrode structures 210A, 210B may be formed, which may both comprise the layers 211, 212, 216 and 213 and the cap layer 215. In the embodiment shown, a spacer structure 205A may be formed on sidewalls of the gate electrode structure 210A, while the gate electrode structure 210B and the active region 202B may be covered by a mask layer 205. In this case, an additional performance enhancing mechanism may be implemented for the transistor corresponding to the active region 202A, for instance by forming cavities therein and growing a strain-inducing semiconductor alloy, such as a silicon/germanium alloy, thereby inducing a strain component which may enhance overall charge carrier mobility and thus transistor performance. Consequently, in highly sophisticated applications, enhanced uniformity of the gate electrode structures 210A, 210B may contribute to overall device uniformity since the basic transistor characteristics, such as threshold voltage, may be determined in an early manufacturing stage by appropriately selecting the materials 211 and 212 in combination with the additional threshold adjusting material 202C. Consequently, the layer 216 may provide superior integrity and thus stability of the previously established material characteristics, thereby contributing to enhanced uniformity of the finally obtained transistor elements.

Figure 2I:
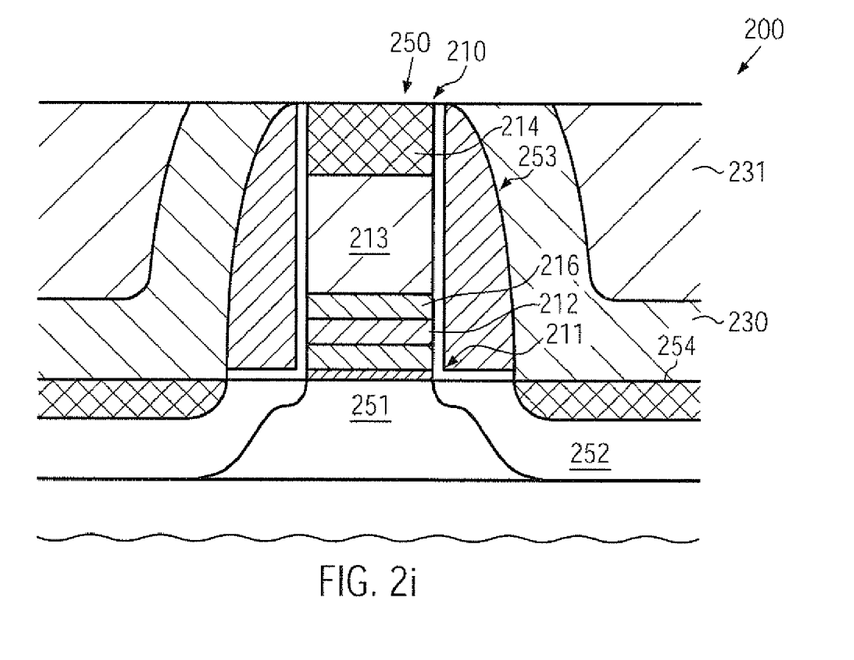

FIG. 2i schematically illustrates the semiconductor device 200 according to further illustrative embodiments in which the final configuration of the gate electrode structure 210 may be determined in a very advanced manufacturing stage. As illustrated, the device 200 may comprise a transistor 250 including the gate electrode structure 210, which may now comprise a metal silicide region 214 formed within the material 213, if comprising a significant portion of a silicon species. Furthermore, drain and source regions 252 are formed in the semiconductor layer 202 and laterally enclose a channel region 251. Furthermore, metal silicide regions 254 may be formed in the drain and source regions 252. Depending on overall process and device requirements, a spacer structure 253 may be formed on sidewalls of the gate electrode structure 210. Additionally, the transistor 250 may be embedded in a dielectric material, for instance in the form of a first layer 230 and a second layer 231, wherein, for instance, in some cases, the layer 230 may be provided in the form of a stress-inducing material, such as a silicon nitride material, a nitrogen-containing silicon carbide material and the like.

The semiconductor device 200 as illustrated in FIG. 2i may be formed on the basis of well-established process techniques, for instance comprising the formation of the drain and source regions 252 after patterning the gate electrode structure 210, as previously described. The drain and source regions 252 may be formed on the basis of the sidewall spacer structure 253, which may have any appropriate degree of complexity, depending on the desired overall dopant profile for the drain and source regions 252. After activating the dopant species in the drain and source regions 252, the metal silicide regions 254, 214 may be formed on the basis of well-established silicidation techniques. Thereafter, the layers 230, 231 may be deposited on the basis of well-established deposition techniques, followed by appropriate planarization processes so as to expose the gate electrode structure 210, i.e., the material 214.

Figure 2J:
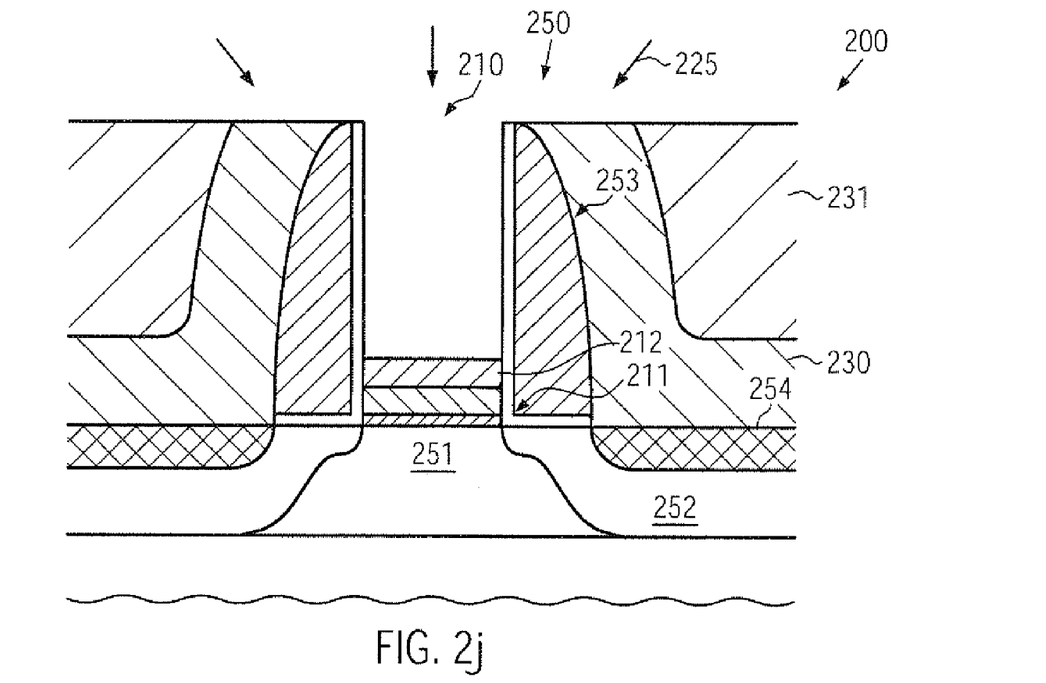

FIG. 2j schematically illustrates the semiconductor device 200 in a further advanced manufacturing stage. As illustrated, the semiconductor device 200 may be exposed to an etch ambient 225 for removing the materials 214 and 213 in combination with the material 216 (FIG. 2i). For this purpose, a plurality of well-approved wet chemical etch recipes, such as potassium hydroxide, TMAH (tetra methyl ammonium hydroxide) and the like, are available. In other cases, highly selective plasma assisted etch recipes may be used, wherein typically these etch recipes have a high degree of selectivity with respect to silicon dioxide material. Consequently, during the etch process 225, enhanced process uniformity may be accomplished compared to conventional strategies since the presence of any silicon dioxide residues may be significantly reduced due to the incorporation of the layer 216 (FIG. 2i). Consequently, the layer 212 may be reliably exposed during the etch process 225.

Figure 2K:
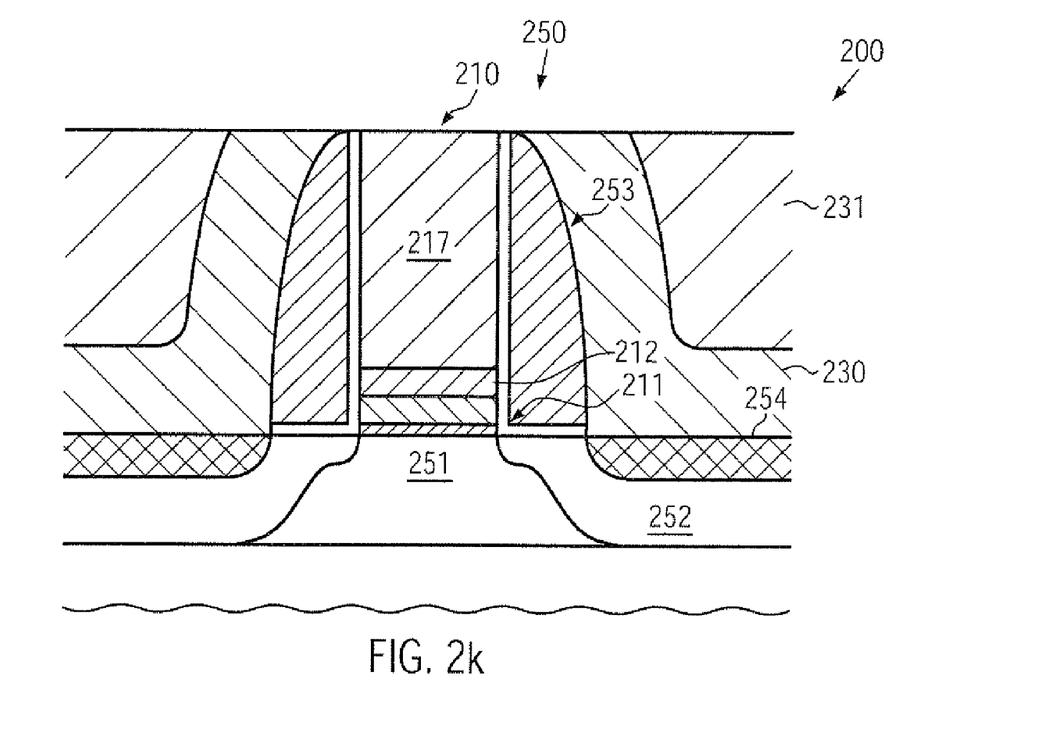

FIG. 2k schematically illustrates the semiconductor device 200 in a further advanced manufacturing stage in which a metal-containing electrode material 217 may be formed on the layer 212, which may be accomplished by depositing an appropriate metal by any appropriate deposition technique, such as sputter deposition, CVD and the like. Thereafter, any excess material may be removed, for instance by chemical mechanical polishing (CMP) and the like. The metal-containing material 217 may be selected so that, in combination with the layer 212, an appropriate work function, and thus threshold, of the transistor 250 may be achieved. Thus, due to the reliable exposure of the layer 212 and the significant reduction of any residues, such as silicon dioxide residues as may typically be encountered in conventional strategies, a reliable and predictable adjustment of the threshold voltage may be accomplished by means of the material 217 in combination with the layer 212. Similarly, in other transistor elements requiring a different work function, a sequence of an etch process and a subsequent deposition of an appropriate metal may be repeated, while the material 217 in the gate electrode structure 210 may act as an etch stop material. Also in this case, superior transistor characteristics may be accomplished.

As a result, the present disclosure provides techniques in which superior integrity of a metal-containing electrode material or cap material may be achieved by providing an additional cover layer, such as a silicon layer, which may provide enhanced flexibility in scheduling the overall process sequence. The additional cover layer may thus result in superior uniformity and performance of transistors in which the characteristics of the gate electrode structure may be adjusted in a very early manufacturing stage. In other approaches, in which a part of the electrode material may be replaced by a work function adjusting metal after completing the basic transistor configuration, the additional cover layer may also provide enhanced process uniformity, thereby contributing to superior stability of transistor characteristics.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a metal-containing electrode material on a gate insulation layer in an oxygen-depleted ambient, said gate insulation layer being formed above a substrate of a semiconductor device and comprising a high-k dielectric material;
    forming a first semiconductor material on said metal-containing electrode material in said oxygen-depleted ambient;
    forming a second semiconductor material above said first semiconductor material;
    forming an etch mask above said second semiconductor material; and
    patterning said second semiconductor material, said first semiconductor material and said metal-containing electrode material so as form a gate electrode structure of a transistor.

2. The method of claim 1, wherein said first semiconductor material is formed at a process temperature of approximately 400° C. or less.

3. The method of claim 1, wherein a thickness of said first semiconductor material is approximately 0.5-3 nm.

4. The method of claim 1, further comprising performing a cleaning process after forming said first semiconductor material and prior to forming said second semiconductor material.

5. The method of claim 4, wherein said cleaning process is performed on the basis of hydrofluoric acid.

6. The method of claim 1, wherein at least one of said first and second semiconductor materials comprises silicon.

7. The method of claim 1, wherein at least one of said first and second semiconductor materials comprises germanium.

8. The method of claim 1, wherein said metal-containing electrode material is formed in a first process chamber and said first semiconductor material is formed in a second process chamber and wherein said oxygen-depleted ambient is established in said first and second process chamber and in a transport channel for transferring said substrate from said first process chamber to said second process chamber.

9. The method of claim 1, further comprising removing said second semiconductor material and forming a metal-containing material on said metal-containing electrode material, wherein said metal-containing material and said metal-containing electrode material determine a work function of said gate electrode structure.

10. The method of claim 1, further comprising forming a semiconductor alloy on a channel region and forming said gate insulation layer on said semiconductor alloy so as to adjust a threshold voltage of said transistor.

11. A method of forming a gate electrode structure of a transistor, the method comprising:
    performing a process sequence for forming a metal-containing material on a gate insulation layer and forming a cover layer on said metal-containing material without exposing said metal-containing material to ambient atmosphere;
    performing a wet chemical cleaning process on said cover layer;
    forming an electrode material above said metal-containing material; and
    patterning at least said metal-containing material and said electrode material to form said gate electrode structure.

12. The method of claim 11, wherein forming said cover layer comprises depositing a semiconductor material at a temperature of approximately 400° C. or less.

13. The method of claim 12, wherein said semiconductor material comprises at least one of silicon and germanium.

14. The method of claim 11, wherein said electrode material comprises at least one of silicon and germanium.

15. The method of claim 14, further comprising forming said gate insulation layer by forming a high-k dielectric material above a channel region of said transistor.

16. The method of claim 15, wherein forming said gate insulation layer further comprises forming a dielectric material layer on said channel region and wherein said high-k dielectric material is formed on said dielectric material layer.

17. The method of claim 14, further comprising forming a threshold adjusting semiconductor alloy on a silicon-based semiconductor layer and forming said gate insulation layer on said threshold adjusting semiconductor alloy.

18. The method of claim 11, further comprising removing said electrode material and forming a metal-containing electrode material on said metal-containing material.

19. A method of forming a gate electrode structure of a transistor, said method comprising:

forming a first electrode material on a gate insulation layer;

forming a second electrode material on said first electrode material while maintaining said first electrode material in an oxygen-depleted ambient, said second electrode material comprising at least one of silicon and germanium;

forming a third electrode material on said second electrode material; and patterning at least said first, second and third electrode materials on the basis of an etch mask.

20. The method of claim 19, further comprising performing a wet chemical cleaning process prior to forming said third electrode material.

21. The method of claim 19, wherein said second electrode material is formed with a thickness of approximately 0.5-3 nm.

22. The method of claim 19, wherein said gate insulation layer comprises a high-k dielectric material.

23. The method of claim 19, further comprising removing said second and third electrode materials and forming a metal-containing electrode material on said first electrode material.

24. The method of claim 19, wherein a length of said first electrode material is less than approximately 50 nm.

\* \* \* \* \*